United States Patent
Ajiki et al.

(10) Patent No.: US 10,290,823 B2
(45) Date of Patent: May 14, 2019

(54) PHOTODETECTOR

(71) Applicants: OLYMPUS CORPORATION, Tokyo (JP); The University of Tokyo, Tokyo (JP); KYUSHU UNIVERSITY, NATIONAL UNIVERSITY CORPORATION, Fukuoka (JP)

(72) Inventors: Yoshiharu Ajiki, Tokyo (JP); Isao Shimoyama, Tokyo (JP); Kiyoshi Matsumoto, Tokyo (JP); Tetsuo Kan, Tokyo (JP); Koichi Karaki, Tokyo (JP); Yasuo Sasaki, Tokyo (JP); Masayuki Yahiro, Fukuoka (JP); Akiko Hamada, Fukuoka (JP); Chihaya Adachi, Fukuoka (JP)

(73) Assignees: Olympus Corporation, Tokyo (JP); The University of Tokyo, Tokyo (JP); Kyushu University, National University Corporation, Fukuoka (JP)

( * ) Notice: Subject to any disclaimer, the term of this patent is extended or adjusted under 35 U.S.C. 154(b) by 0 days.

(21) Appl. No.: 14/936,244

(22) Filed: Nov. 9, 2015

(65) Prior Publication Data

US 2016/0064679 A1    Mar. 3, 2016

Related U.S. Application Data

(63) Continuation of application No. PCT/JP2014/059060, filed on Mar. 20, 2014.

(30) Foreign Application Priority Data

May 23, 2013 (JP) ................................. 2013-109015

(51) Int. Cl.
  *H01L 51/44*  (2006.01)
  *H01L 51/00*  (2006.01)
  (Continued)

(52) U.S. Cl.
  CPC ........ *H01L 51/441* (2013.01); *H01L 51/0068* (2013.01); *H01L 51/0081* (2013.01);
  (Continued)

(58) Field of Classification Search
  None
  See application file for complete search history.

(56) References Cited

U.S. PATENT DOCUMENTS 6,946,597 B2 * 9/2005 Sager ................. H01L 51/4213
                                                       136/255
2006/0234505 A1 * 10/2006 Asano ..................... B82Y 10/00
                                                       438/688

(Continued)

FOREIGN PATENT DOCUMENTS

JP    2007-303927 A    11/2007
JP    2011-108722 A     6/2011

(Continued)

OTHER PUBLICATIONS

Qiao, Linfang, et al. "Localized surface plasmon resonance enhanced organic solar cell with gold nanospheres." Applied Energy 88.3 (2011): 848-852.*

(Continued)

*Primary Examiner* — Walter H Swanson
*Assistant Examiner* — Kien C Ly
(74) *Attorney, Agent, or Firm* — Scully, Scott, Murphy & Presser, P.C.

(57) ABSTRACT

Provided is a photodetector including: an organic semiconductor (20) having protrusions; a metal layer (30) added onto the organic semiconductor (20), for promoting at least one of localized plasmon resonance and surface plasmon resonance in which electrons are excited through irradiation of detection light; and a semiconductor (40) forming a junction with the metal layer (30), for allowing electrons (Continued)

excited through the plasmon resonance to pass through the junction (40a) with the metal layer (30).

16 Claims, 12 Drawing Sheets

(51) Int. Cl.
 *H01L 51/42* (2006.01)
 *G01J 1/42* (2006.01)
(52) U.S. Cl.
 CPC ........ *H01L 51/0091* (2013.01); *H01L 51/424* (2013.01); *H01L 51/4213* (2013.01); *H01L 51/4253* (2013.01); *G01J 1/42* (2013.01); *Y02E 10/549* (2013.01); *Y02P 70/521* (2015.11)

(56) References Cited

U.S. PATENT DOCUMENTS

| | | | | |
|---|---|---|---|---|
| 2007/0111368 | A1* | 5/2007 | Zhang | B82Y 10/00 438/99 |
| 2007/0181648 | A1* | 8/2007 | Parker | H01L 27/28 228/101 |
| 2007/0262239 | A1* | 11/2007 | Niigaki | H01L 31/02162 250/208.1 |
| 2010/0104985 | A1* | 4/2010 | Watanabe | C09B 23/0091 430/323 |
| 2010/0200051 | A1* | 8/2010 | Triani | H01G 9/2031 136/255 |
| 2011/0039459 | A1* | 2/2011 | Yancey | B82Y 10/00 439/884 |
| 2011/0114921 | A1* | 5/2011 | Yang | H01L 51/0096 257/40 |
| 2011/0116168 | A1* | 5/2011 | Nikoobakht | B82Y 20/00 359/585 |
| 2012/0048368 | A1* | 3/2012 | Chaudhary | B82Y 10/00 136/256 |
| 2013/0143414 | A1* | 6/2013 | Thomas | H01L 31/02246 438/761 |
| 2014/0263945 | A1* | 9/2014 | Huang | H01L 51/428 250/200 |
| 2015/0372046 | A1* | 12/2015 | Kim | H01L 27/283 250/338.4 |

FOREIGN PATENT DOCUMENTS

| | | |
|---|---|---|
| JP | 2012-233779 A | 11/2012 |
| JP | 2012233779 A * | 11/2012 |

OTHER PUBLICATIONS

Altin, E., et al., "Dark current and optical properties in asymmetric GaAs/AlGaAs staircase-like multiquantum well structure", Infrared Physics and Technology, May 2013, pp. 74-79, vol. 58.

Mock, J.J., et al., "Shape effects in plasmon resonance of individual colloidal silver nanoparticles", Journal of Chemical Physics, Apr. 15, 2002, pp. 6755-6759, vol. 116, No. 15.

Kato, K., "Surface Plasmon Excitations and Emission Lights in Nanostructured Organic Dye Films", The Institute of Electronics, Information and Communication Engineers, 2011, pp. 1-6.

Casalino, M., et al., "A silicon compatible resonant cavity enhanced photodetector working at 1.55 μm", Semiconductor Science and Technology, 2008, pp. 1-7, vol. 23, No. 7.

Cui, Y., et al., "Ultrabroadband Light Absorption by a Sawtooth Anisotropic Metamaterial Slab", Nano Letters, 2012, pp. 1443-1447, vol. 12, No. 3.

International Search Report dated Apr. 28, 2014 issued in PCT/JP2014/059060.

Japanese Office Action dated Apr. 11, 2017 in Japanese Patent Application No. 2013-109015.

Japanese Office Action dated Aug. 29, 2017 in Japanese Patent Application No. 2013-109015.

\* cited by examiner

PHOTODETECTOR

CROSS REFERENCE TO RELATED APPLICATIONS

The present application is a Continuing Application based on International Application PCT/JP2014/059060 filed on Mar. 20, 2014, which, in turn, claims the priority from Japanese Patent Application No. 2013-109015 filed on May 23, 2013, the entire disclosures of which is incorporated herein by reference.

TECHNICAL FIELD

This disclosure relates to a photodetector.

BACKGROUND

In recent years, there have been proposed various photodetectors including, for example: the one having a quantum well structure (see, for example, Non-patent Literature (NPL) 1); the one having, in place of the quantum well, an infrared absorber using a metal (Au)/semiconductor material (Ge) (metamaterial type) (see, for example, NPL 2); the one utilizing a metal-semiconductor junction using silicon (see, for example, NPL 3); and the one having antenna layers for generating surface plasmon resonance (see, for example, Patent Literature (PTL) 1).

CITATION LIST

Patent Literature

PTL 1: JP 2007-303927 A

Non-Patent Literature

NPL 1: Altin, E., M. Hostut, and Y. Ergun. "Dark current and optical properties in asymmetric GaAs/AlGaAs staircase-like multi quantum well structure." Infrared Physics & Technology (2013)

NPL 2: Yanxia Cui, Kin Hung Fung, Jun Xu, Hyungjin Ma, Yi Jin, Sailing He, and Nicholas X. Fang, "Ultrabroadband Light Absorption by a Sawtooth Anisotropic Metamaterial Slab", Nano letters, Vol. 12, No. 3, pp. 1443 to 1447 (2012)

NPL 3: Casalino, M.; Sirleto, L.; Moretti, L. & Rendina, "A silicon compatible resonant cavity enhanced photodetector working at 1.55 µm.", Semicond. Sci. Technol., Vol. 23, No. 7, pp. 075001 (2008)

SUMMARY

However, the photodetector disclosed in NPL 1 uses a compound semiconductor, which lacks affinity to the silicon process. In other words, the materials for the compound semiconductor need to be controlled finely and at high temperature, which means that the presence of contamination (contaminant), if any, may affect the material composition due to the diffusion of the contamination, resulting in failure to provide a desired material. For this reason, difficulty may be anticipated in integrating the aforementioned photodetectors onto a silicon device using the process of film formation or the like. Therefore, in consideration of forming a quantum well using a silicon device, NPL1 finds it theoretically impossible to laminate crystalline silicon and amorphous silicon through conventional evaporation process for the following reason. That is, a process of annealing amorphous silicon at high temperature for recrystallization is required in order to obtain crystalline silicon.

The photodetector disclosed in NPL 2 utilizes plasmonic resonance of metals to absorb infrared light. However, difficulty is anticipated in the fabrication of such photodetector, due to the aforementioned problem of metal contamination.

The photodetector disclosed in NPL 3 uses a metal-semiconductor junction using silicon, and thus can be fabricated with more ease as compared with the photodetectors disclosed in NPL 1 and NPL 2. However, silicon shows low detection sensitivity to light in the infrared region, and thus the wavelength of the detection light is to be subjected to limitation.

The photodetector disclosed in PTL 1 is configured to generate surface plasmon resonance in antenna layers to thereby output near field light from through holes of the antenna layers, so as to receive the near field light by a light receiving layer through light receiving surfaces over the areas of the through holes. Thus, according to the photodetector configured as above, the antenna layers may suitably be configured to generate surface plasmon by light at a desired wavelength, so as to detect light even if it is in the infrared region. However, in the aforementioned photodetector, the antenna layers constitute a grating structure, which means that the detection sensitivity will have incident angle dependence, failing to obtain stable detection sensitivity across a wide range of incident angles.

It could therefore be helpful to provide a photodetector, including:
an organic semiconductor having protrusions;
a metal layer added onto the organic semiconductor, for promoting at least one of localized plasmon resonance and surface plasmon resonance in which electrons are excited through irradiation of detection light; and
a semiconductor forming a junction with the metal layer, for allowing electrons excited through the plasmon resonance to pass through the junction with the metal layer.

The protrusions may each have a height including the metal layer being equal to or smaller than the wavelength of the detection light and the protrusions may each have a maximum dimension in thickness being equal to or smaller than the wavelength of the detection light.

The semiconductor may be an organic semiconductor.

The photodetector may further include a substrate for supporting the semiconductor.

The substrate may be a semiconductor substrate.

The substrate is a conductive substrate.

The substrate is an insulating substrate.

The substrate is an inorganic semiconductor.

The protrusions may each have a height, including the metal layer, of 20 nm or more.

The protrusions may each have a height, including the metal layer, of 50 nm or more.

The metal layer may have a concavo-convex structure having protrusions and recesses each being adjacent to the respective protrusions, and the protrusions in the concavo-convex structure may each have a dimension in height equal to or smaller than the wavelength of the detection light and have a maximum dimension in thickness that is equal to or smaller than the wavelength of the detection light.

The protrusions including the metal layer may each be formed as being curved or bent into an arbitrary shape.

The protrusions including the metal layer may be in irregularly formed columnar shapes.

The organic semiconductor having protrusions may be formed through crystal growth.

The organic semiconductor may be formed of any of: a phthalocyanine-based material; a thiophene-based material; and Alq3.

The metal layer is formed of any of: Au; Pt; Al; and Ag.

The semiconductor may be formed of any of: a phthalocyanine-based material; a thiophene-based material; Alq3; and silicon.

The metal layer added onto the organic semiconductor may promote localized plasmon resonance.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

In the accompanying drawings.

DETAILED DESCRIPTION

Explained first is the principle of a photodetector disclosed herein.

Figure 1:
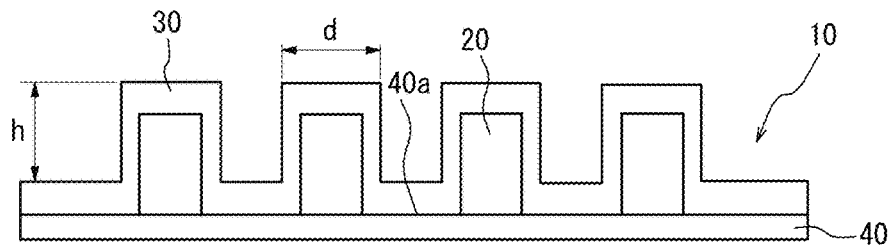
FIG. 1 is a sectional view illustrating a principal configuration of a photodetector disclosed herein.

FIG. 1 is a sectional view illustrating a principal configuration of the disclosed photodetector. The photodetector 10 includes: an organic semiconductor 20; a metal layer 30; and a semiconductor 40. The organic semiconductor 20 is formed as a plurality of protrusions on the semiconductor 40, so as to form, together with the semiconductor 40, a concavo-convex structure having protrusions and recesses each being adjacent to the respective protrusions. The metal layer 30 is added onto the organic semiconductor 20 and the semiconductor 40 in a concavo-convex structure, so as to promote at least one of localized plasmon resonance and surface plasmon resonance through irradiation of detection light. Accordingly, the protrusions of the concavo-convex structure each have a height h, including the metal layer 30, equal to or smaller than the wavelength of the detection light, and have a thickness equal to or smaller than the wavelength of the detection light, where: the height h corresponds a width in the vertical direction between the protrusion; and the recess of the metal layer and the thickness corresponds to a maximum dimension d in a plane orthogonal to the extending direction (height direction) of the protrusion. This allows the plasmon resonance to be more effectively promoted. Here, the height h of the protrusion may preferably be $1/10$ to $1/5$ of the detection wavelength. In this case, the localized plasmon can be effectively excited (see, for example. J. J. Mock, M. Barbic, D. R. Smith, D. A. Schultz, and S. Schultz, "Shape effects in plasmon resonance of individual colloidal silver nanoparticles", J. Chem. Phys. 116, 6755 (2002)). Further, the protrusions may be formed in arbitrary shapes such as columnar or prismatic, which may be regularly formed or may be irregularly formed as standing close together.

The semiconductor 40 is made of an organic semiconductor or an inorganic semiconductor, and allows the electrons excited by plasmon resonance occurring in the metal layer 30 to pass through via a junction 40a with the metal layer 30. This configuration allows for implementation of an operation of promoting light absorption through plasmon resonance. Note that the semiconductor 40 may preferably be supported on a substrate, so as to allow for various implementations.

Figure 2A:
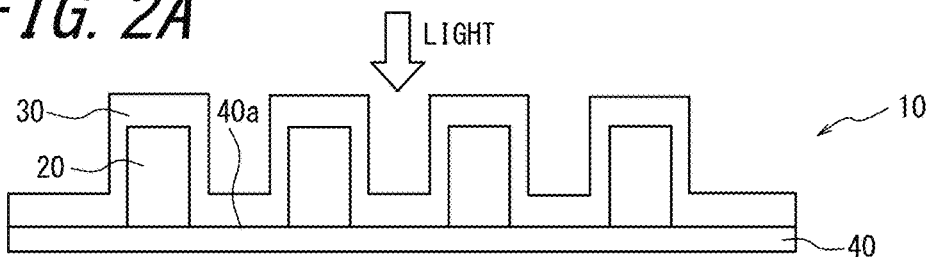
FIG. 2A are views for illustrating an operation of the photodetector of FIG. 1.
Figure 2B:
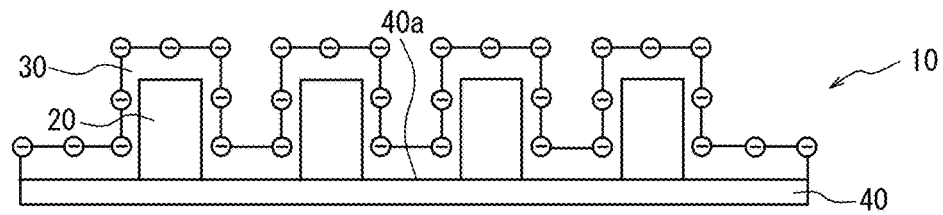
FIG. 2B are views for illustrating an operation of the photodetector of FIG. 1.

FIGS. 2A to 2D are views for illustrating an operation of the photodetector 10 of FIG. 1. First, as illustrated in FIG. 2A, when light is incident on the metal layer 30 with a concavo-convex structure, the wavelength of the incident light conforms to the dimensions of the concavo-convex structure, to thereby generate localized plasmon resonance and/or surface plasmon resonance. As a result, as illustrated in FIG. 2B, electrons in the metal layer 30 are excited. A larger number of electrons are excited by the plasmon resonance, as compared with the case where no plasmon resonance is excited, that is, the case where the incident light is subjected to total reflection.

Figure 2C:
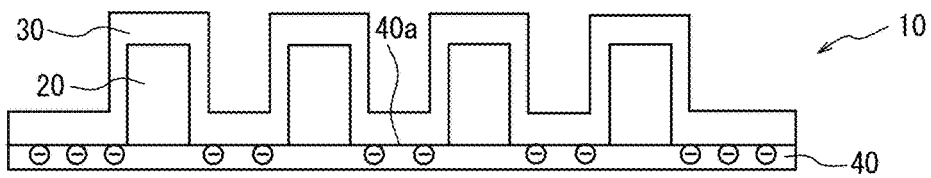
FIG. 2C are views for illustrating an operation of the photodetector of FIG. 1.
Figure 2D:
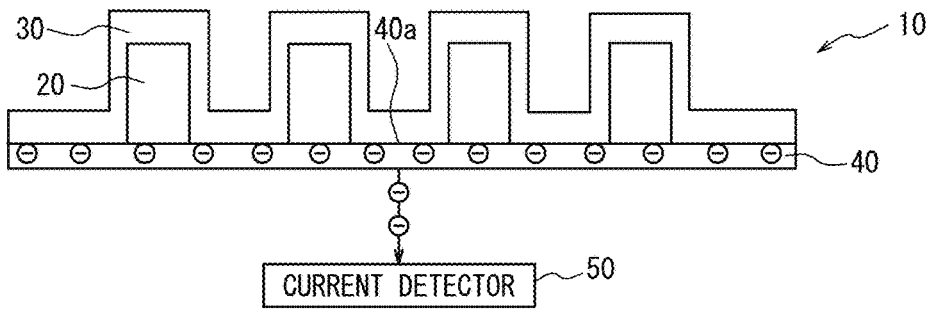
FIG. 2D are views for illustrating an operation of the photodetector of FIG. 1.
Figure 3:
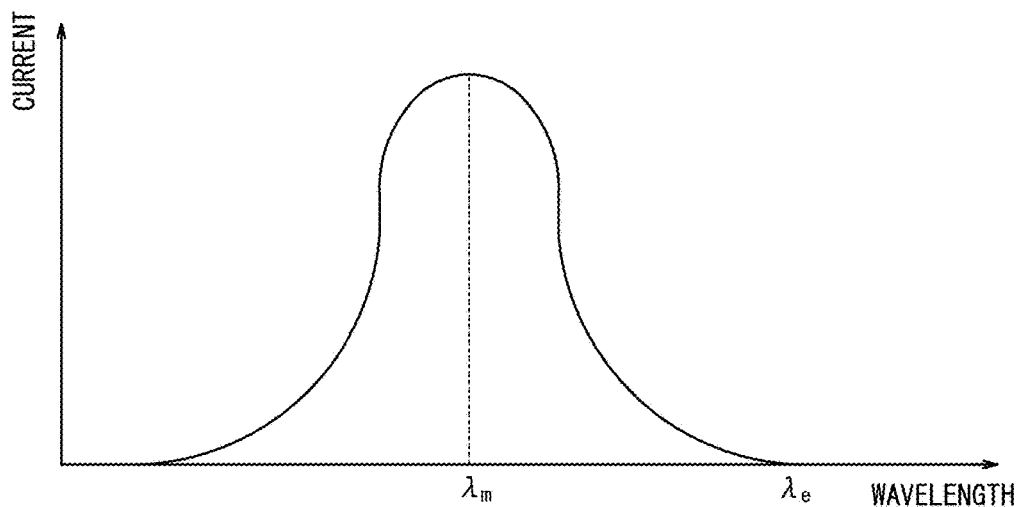
FIG. 3 is a graph showing a relation between the wavelength of incident light and the detected current according to the photodetector of FIG. 1.

The electrons excited in the metal layer 30 pass through the junction 40a between the metal layer 30 and the semiconductor 40 as illustrated in FIG. 2C. Here, an electric field is formed in the junction 40a due to the contact between metal and semiconductor, and thus the excited electrons need to overcome a Schottky barrier at the metal-semiconductor at the junction 40a so as to flow as a diffusion current. Therefore, as illustrated in FIG. 2D, a current flowing though the semiconductor 40 may be detected by a current detector 50 such as an ammeter, to thereby detect the incident light. The junction 40a may be applied with a potential in order to make steep the electric field at metal-semiconductor interfaces at the junction 40a FIG. 3 is a graph showing a relation between the wavelength of the incident light and the detected current in the photodetector 10.

The photodetector 10 of FIG. 1 uses the organic semiconductor 30, which allows for easy fabrication and integration. Further, the concavo-convex structure may be designed with proper dimensions, to thereby change the light absorption wavelength $\lambda m$ of FIG. 3, which allows for tuning of the photodetection wavelength. In FIG. 2C, electrons excited in the metal layer 30 overcome the barrier at the junction 40a, which means that the wavelength bandwidth ($\lambda e$ of FIG. 3) of light to be detected can be tuned by tuning the barrier. In particular, in the case of using an organic semiconductor to form the semiconductor 40, the material can be selected from a wider variety of choices as compared with the case of using an inorganic semiconductor, which provides an effect that the barrier can be controlled with ease. In other words, the Schottky barrier at the junction with the metal layer can be tuned, which can allow a greater quantity of electrons to overcome the barrier to thereby improve the sensitivity while allowing for tuning of the sensitivity bandwidth. The organic semiconductor 30 is formed in a protruding shape (columnar shape), and thus light in the infrared region may even be detected with high sensitivity irrespective of the incident angle.

Here, the organic semiconductor 20, the metal layer 30, and the semiconductor 40 constituting the aforementioned photodetector 10, and a substrate supporting the semiconductor 40 may be formed of, for example, an arbitrary combination of the materials shown in Table 1, but not limited thereto. For example, the organic semiconductor 20 is not limited to CuPc, and may be formed of any other phthalocyanine-based material or may be formed of a thiophene-based material and Alq3. The substrate may be a semiconductor substrate. This allows the use of a versatile substrate such as a silicon substrate, which leads to cost reduction and easy integration, making it possible to expand the range of application. The substrate may also be a conductive substrate. This allows the use of a flexible conductive substrate such as ITO/PET, ITO/polyimide, and aluminum foil, making it possible to implement a flexible photodetector. Alternatively, the substrate may be an insulating substrate. This allows for surface mounting on an insulating substrate such as a glass substrate, which expands the range of application.

TABLE 1

| Metal Layer | Semiconductor Layer | Semiconductor | Substrate |
|---|---|---|---|
| Au | CuPc | M-Pc M: Mg, Ni, Cu (phthalocyanine-based) | silicon |
| Pt | | P3HT, PEDOT (thiophene-based) | ITO/PET |
| Al | | Alq3 | ITO/polyimide |
| Ag | | silicon | glass |

In Table 1, assuming an exemplary case where: Al is used for the metal layer 30; CuPc is used for the organic semiconductor 20; and silicon is used for the semiconductor 40 and the substrate, the difference between the Al work function (4.1 eV) and the silicon electron affinity (4.15 eV) becomes equivalent to the barrier height (0.05 eV), and thus the detection light has a wavelength $\lambda$ of 20 μm or less ($\lambda \leq 20$ μm). The selection of the materials from Table 1 may further be optimized so as reduce the barrier height, to thereby increase the wavelength of the detection light.

In the following, description is given of Examples the present disclosure. In Example below, the photodetectors are composed of the materials shown in Table 2.

TABLE 2

| Example | Metal Layer | Semiconductor Layer | Semiconductor | Substrate |
|---|---|---|---|---|
| 1 | Au | CuPc | CuPc | silicon |
| 2 | | | CuPc | ITO/polyimide |
| 3 | | | CuPc | glass |
| 4 | | | silicon | silicon |

EXAMPLES

Example 1

Figure 4:
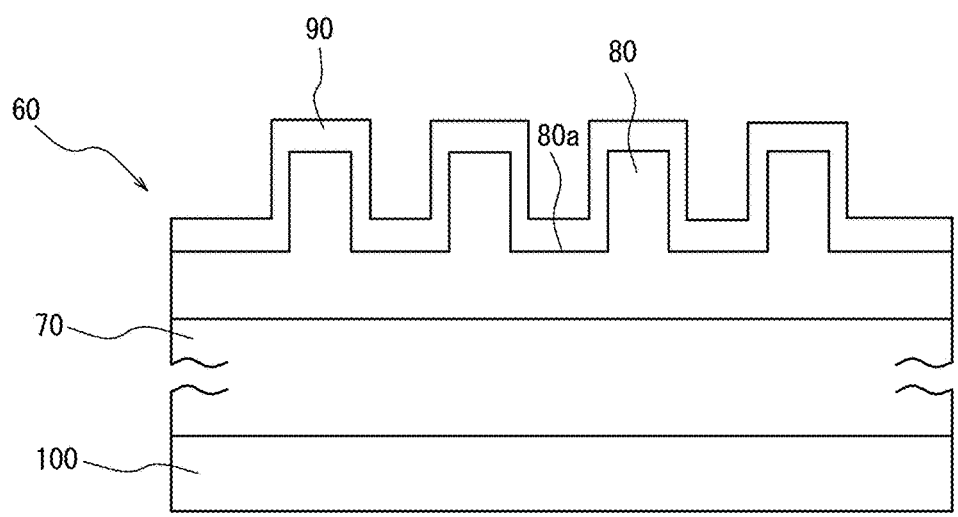
FIG. 4 is a sectional view illustrating a schematic configuration of the photodetector according to Example 1.

FIG. 4 is a sectional view illustrating a schematic configuration of a photodetector according to Example 1. The photodetector 60 of FIG. 4 includes a silicon substrate 70 as an inorganic semiconductor, formed on which is an organic semiconductor portion 80 made of PTCDA/CuPc, the organic semiconductor portion 80 constituting the organic semiconductor 20 and the semiconductor 40 of FIG. 1, with a Au layer 90, which constitutes the metal layer 30 of FIG. 1, being formed on the concavo-convex structured surface of the organic semiconductor portion 80. Formed on the rear surface of the silicon substrate 70 is a Al layer 100 for taking out an output current.

In the photodetector 60 of FIG. 4, incidence of light onto the concavo-convex structured Au layer 90 generates localized plasmon resonance and/or surface plasmon resonance, which excites electrons in the Au layer 90. The electrons excited in the Au layer 90 overcome a Schottky barrier at the junction 80a between the Au layer 90 and the organic semiconductor portion 80 to be injected into the organic semiconductor portion 80, so as to be taken out from the Al layer 100 via the silicon substrate 70.

Figure 5A:
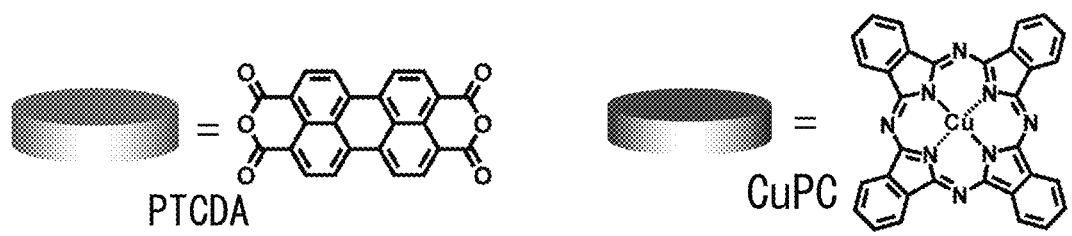
FIG. 5A are a flowchart for illustrating an exemplary method of manufacturing the photodetector of Example 1.
Figure 5A:
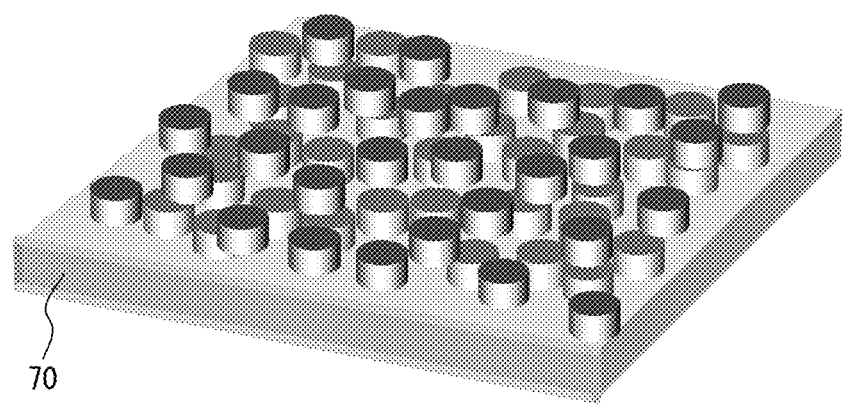
Figure 5B:
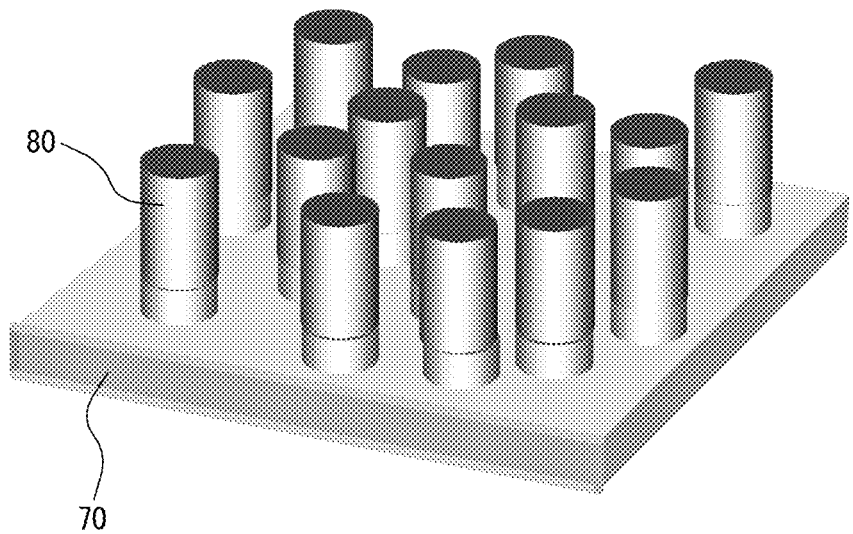
FIG. 5B are a flowchart for illustrating an exemplary method of manufacturing the photodetector of Example 1.

FIGS. 5A and 5B and FIGS. 6A and 6B are flowcharts for illustrating an exemplary method of manufacturing the photodetector 60 of FIG. 4. First, as illustrated in FIG. 5A, two different organic semiconductors (PTCDA/CuPc) are each vapor-deposited to a thickness corresponding to, for example, 3 nm onto a surface of the n-type single crystal silicon substrate 70 having a plane direction of (100) with resistivity $\rho$ of 40 Ωcm ($\rho$=40 Ωcm). PTCDA serves as identifying sites to grow CuPc forming protrusions. Thereafter, the silicon substrate 70 is heated at 80° C. to 230° C. for 1 hour so as to subject CuPc to crystal growth as illustrated in FIG. 5B, to thereby form the organic semiconductor portion 80 having a concavo-convex structure. Here, FIG. 5B omits the illustration of CuPc formed on the recesses of the concavo-convex structured silicon substrate 70.

Figure 6A:
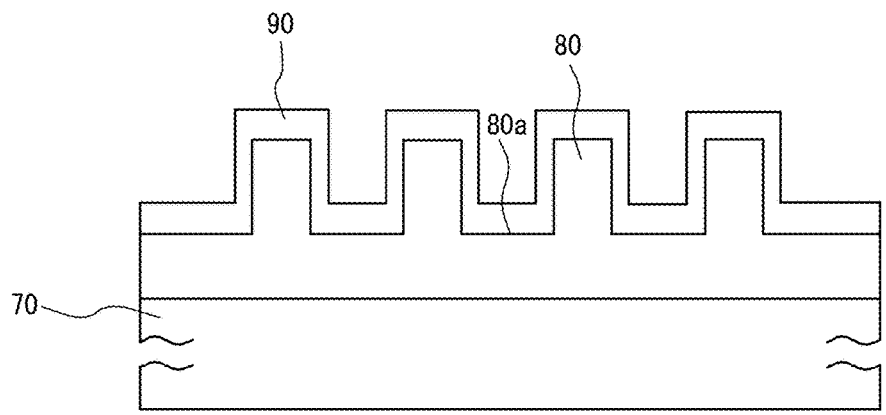
FIG. 6A are a flowchart for illustrating an exemplary method of manufacturing the photodetector of Example 1.
Figure 6B:
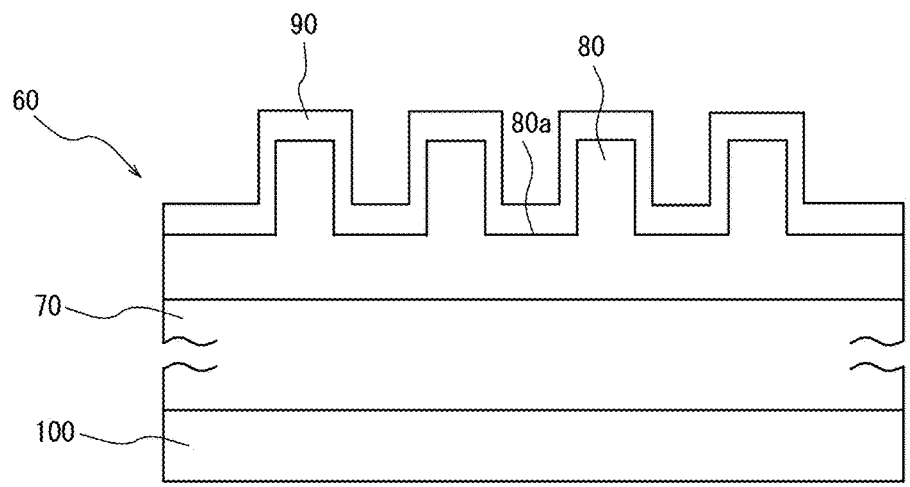
FIG. 6B are a flowchart for illustrating an exemplary method of manufacturing the photodetector of Example 1.

Next, a vacuum vapor deposition device (degree of vacuum=$1.0 \times 10^{-4}$ Pa) is used to vapor-deposit Au onto the surface of the concavo-convex structure of the organic semiconductor portion 80 so as to form the Au layer 90 as illustrated in FIG. 6A. Lastly, a vacuum vapor deposition device (degree of vacuum=$4.0 \times 10^{-4}$ Pa) is used to vapor-deposit Al onto the surface of the silicon substrate 70 so as to form the Al layer 100 as illustrated in FIG. 6B, to thereby complete the photodetector 60.

Figure 7A:
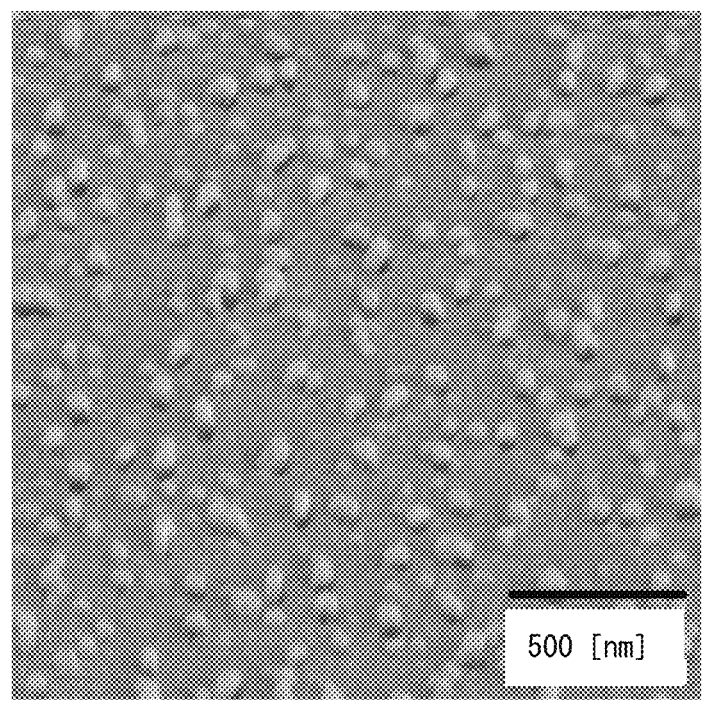
FIG. 7A are electron microscope images of the photodetector of Example 1.
Figure 7B:
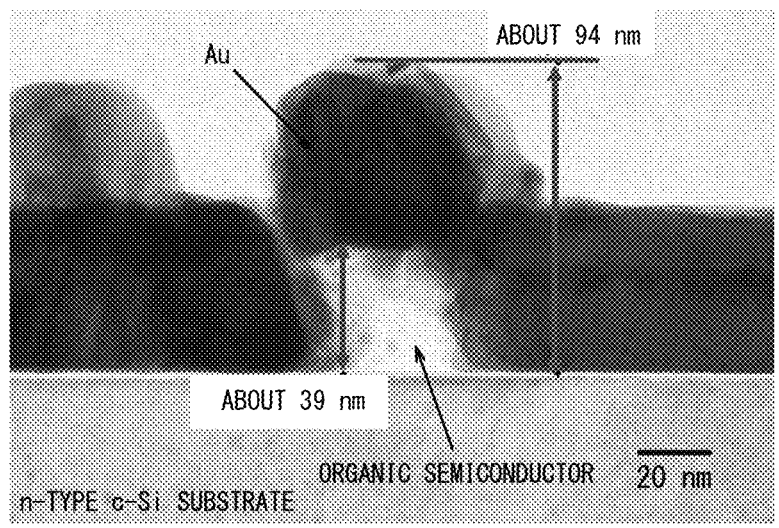
FIG. 7B are electron microscope images of the photodetector of Example 1.

FIGS. 7A and 7B are electron microscope images of the photodetector 60 fabricated as described above, in which: FIG. 7A shows a surface image of the concavo-convex structure of the photodetector 60 taken by a scanning electron microscope (SEM); and FIG. 7B shows a sectional image of the photodetector 60 taken by a transmitting electron microscope (TEM). The electron microscope images of FIGS. 7A and 7B both show the photodetector 60 having the organic semiconductor portion 80 formed by heating the silicon substrate 70 at 200° C. for 1 hour so as to subject CuPc to crystal growth.

As is apparent from FIG. 7A, it can be seen that nano-sized protrusions are standing close together on the surface of the photodetector 60. Further, as is apparent from FIG. 7B, it can be seen that the Au layer 90 is vapor-deposited so as to surround the protrusion of the organic semiconductor portion 80. As is also apparent from FIG. 7B, the Au layer 90 and the silicon substrate 70 are not in direct contact with each other, with an organic semiconductor layer which constitutes the organic semiconductor portion 80 being interposed therebetween having a thickness of 10 nm or less. Meanwhile, it can be appreciated that the protrusion of the concavo-convex structure of the photodetector 60 has a height, which corresponds to the depth of the recess, of 50 nm or more. The silicon substrate 70 was heated at 110° C. for 1 hour to subject CuPc to crystal growth to thereby form the organic semiconductor portion 80, so as to similarly form the photodetector 60. The photodetector 60 thus formed was observed to find that the photodetector 60 in this case has a protrusion with a height of 20 nm or more.

Next, description is given of how we investigated the plasmon absorption effect of the photodetector 60 according to the disclosed Examples. The effect was investigated through an electromagnetic field simulation in the concavo-convex structure, with the use of "COMSOL Multiphysics" (trade name), a general-purpose physical software. Specifically, light was irradiated onto a substrate having Au protrusions standing close together, and it was investigated whether the absorption peak is present in the near-infrared region.

Figure 8:
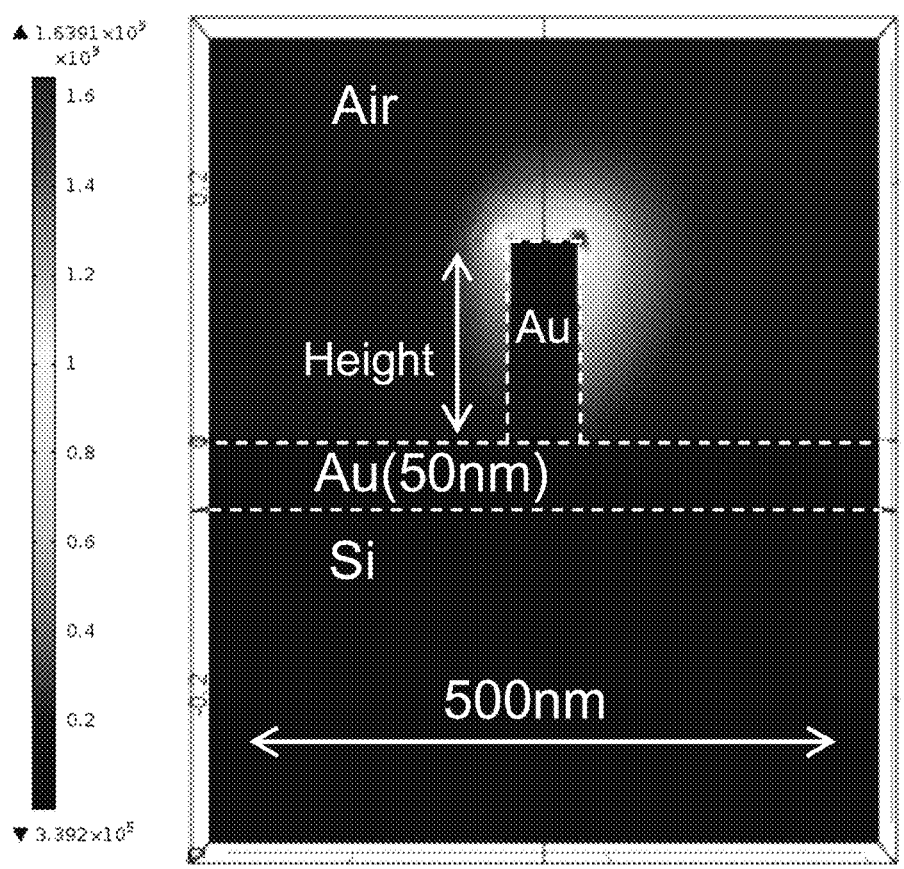
FIG. 8 is an analytical photogrammetry showing a model of computation with the computation result of the electric field intensity distribution, for investigating the plasmon absorption effect of the photodetector of Example 1.

FIG. 8 is an analytical photogrammetry showing a model of computation with the computation results of the electric field distribution. The model of computation includes; a silicon substrate; and a Au thin film vapor-deposited to 50 nm in thickness onto the silicon substrate, with an Au protrusion of 50 nm in width and h nm in height standing in the center. For the sake of simplicity, the organic semiconductor was omitted from the computation. As the boundary condition, the periodic boundary condition was applied in the lateral direction of the protrusion, and thus, in the case of FIG. 8, the model will be configured to have protrusions standing close together at a pitch of 500 nm on the Au thin film so as to fill the plane. Here, TM (Transverse Magnetic) wave is vertically incident from the upper surface side onto the height h of the protrusion and the pitch of the protrusion, so as to calculate the absorptance of the substrate surface through 1-T-R computation based on the reflectance R and the transmittance T.

Figure 9:
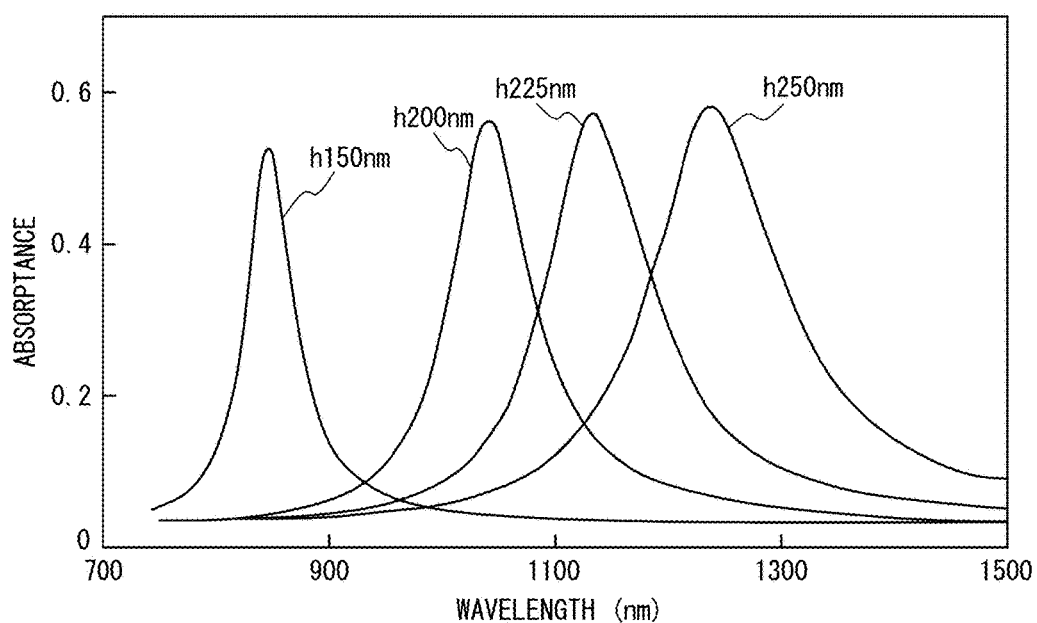
FIG. 9 is a graph showing the absorptance spectra relative to the height of Au thin film obtained by the calculation model of FIG. 8.

FIG. 9 is a graph showing the absorptance spectra relative to different heights h in the aforementioned case. Referring to FIG. 9, it has turned out that the protrusions having h=150 nm to 250 nm are each increased in absorption at the resonance of a single peak in the red visible light region. Note that the protrusions of FIG. 9 have a pitch of 400 nm.

The result shows that the shape of the concavo-convex structure determines the absorption wavelength ($\lambda$m of FIG. 3). Further, referring to FIG. 8, it can be identified that the electric field strength distribution is generated around the protrusion when the resonance is being generated, which suggests that a dipolar plasmon mode is being excited. In order to investigate whether the vibration at the absorption peak is a dipolar response in reality, the vector representation of the electric field strength was analyzed.

Figure 10:
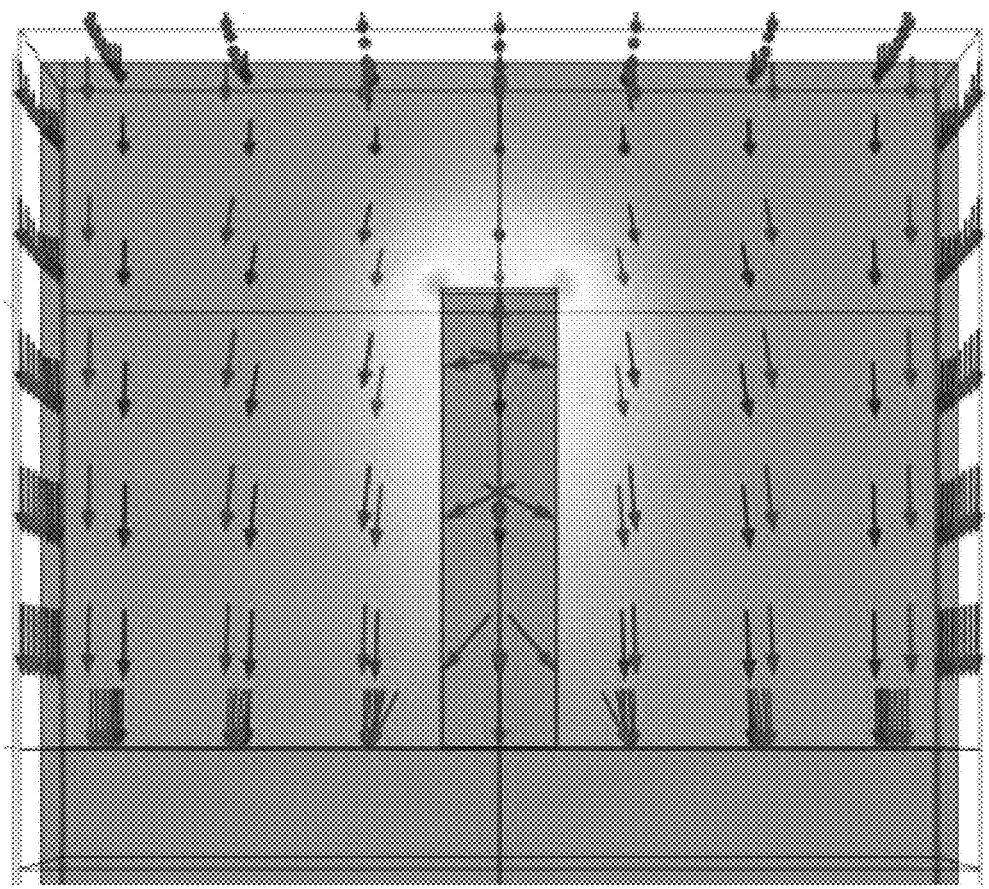
FIG. 10 is an analytical photogrammetry showing the electric field strength distribution in the photodetector of FIG. 8.

FIG. 10 is an analytical photogrammetry showing the electric field strength distribution. Referring to FIG. 10, it can be identified that an electric field starting from the tip of each of the protrusion is vertically incident on the substrate surface to terminate thereon. This means that the protrusion formed upright from the Au thin film surface excites negative charges at the mirror image position within the substrate, leading to a possibility that a dipolar electric field strength distribution be formed in the upper half.

Figure 11:
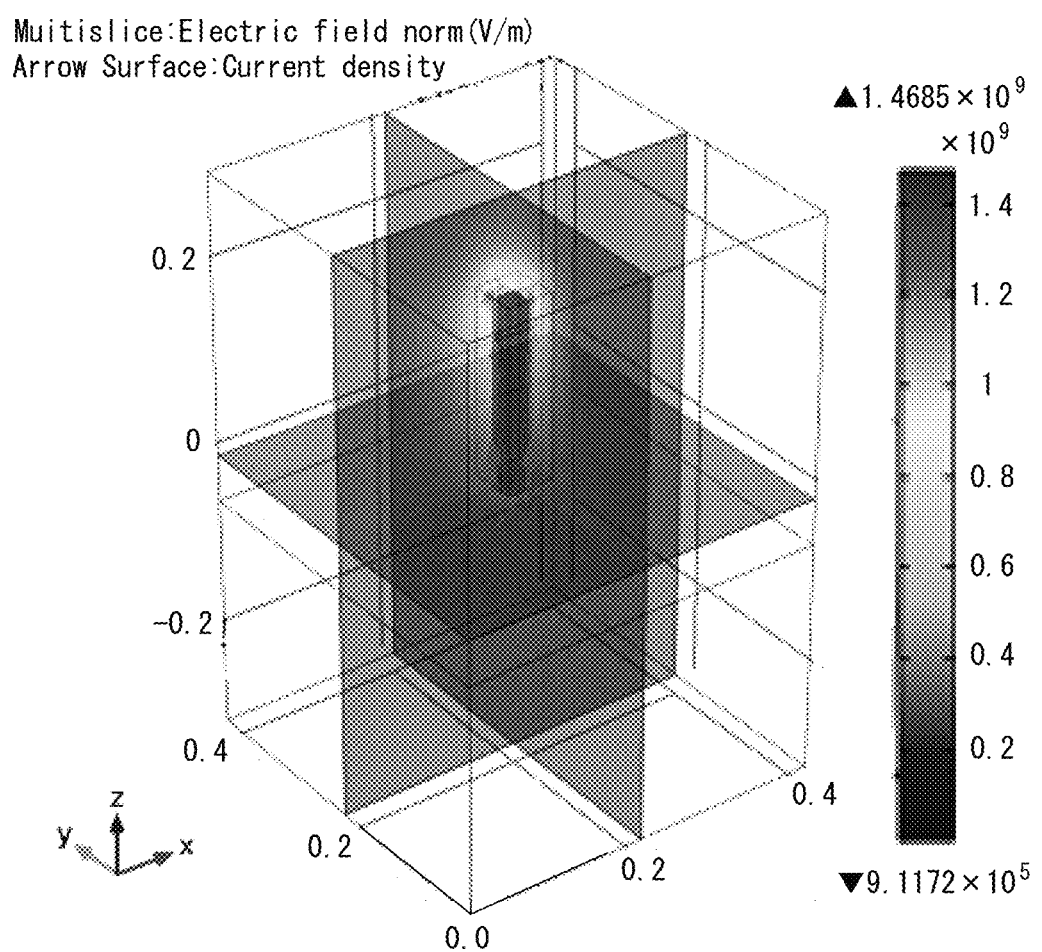
FIG. 11 is an analytical photogrammetry visualizing the current distribution in the model of computation of FIG. 8.

FIG. 11 is an analytical photogrammetry visualizing the current distribution of the aforementioned case. FIG. 11 shows that currents are flowing toward the tip of the protrusion, which suggested increase in charge density at the tip of the protrusion.

Based on the aforementioned analysis, we have found that the charge distribution was generated at the tip of the protrusion during resonance, exciting a dipolar plasmon mode. Accordingly, in the photodetector 60 according to this Example, the plasmon resonance in the surface structure may possibly be promoting light absorption/detection.

Figure 12A:
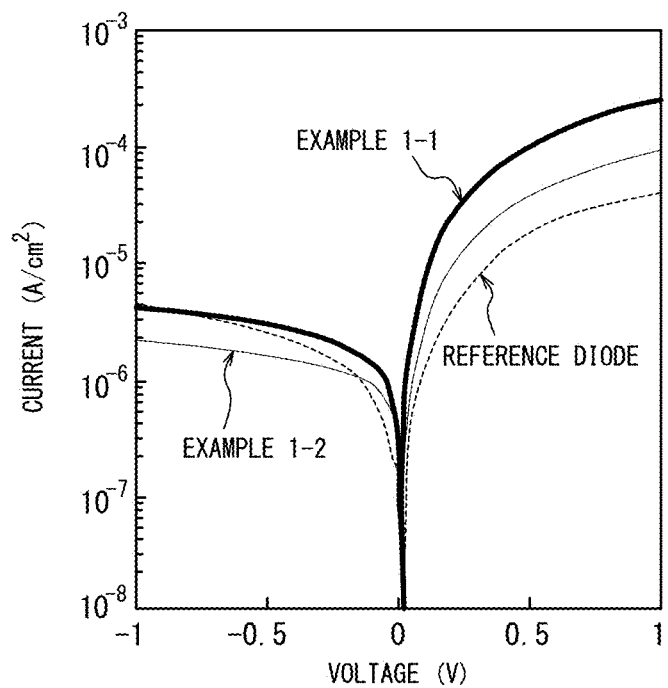
FIG. 12A are graphs each showing the electrical characteristics and the spectral sensitivity characteristic, respectively, of the photodetector of Example 1.

Further, we obtained the electric characteristic of the photodetector 60 in order to confirm the effect thereof. First, the Au layer 90 side and the n-type silicon substrate 70 side of the photodetector are each set as a positive electrode and a negative electrode, respectively, so as to obtain current-voltage characteristics. The result thereof is shown in FIG. 12A. Referring to FIG. 12A, Example 1-1 shows the photodetector 60 obtained by heating the silicon substrate 70 at 200° C. to form the organic semiconductor portion 80 having a concavo-convex structure. Further, Example 1-2 shows a photodetector 60 obtained by heating the silicon substrate 70 at 110° C. to form the organic semiconductor portion 80 having a concavo-convex structure.

FIG. 12A also shows the results obtained by measuring a reference diode serving as a reference device, the reference diode having no concavo-convex structure and being formed of a Au/n-type silicon junction (the Au has a thickness of 50 nm).

According to the results shown in FIG. 12A, the carriers flowing in the forward direction can be considered as electrons (see Sze S M 1981 Physics of Semiconductor Devices 2nd edn (NewYork: Wiley)). Further, in investigating the properties of these diodes, it is important to obtain the parasitic resistance Rs, the Schottky barrier height $\Phi$b, and n value of each of these diodes. In particular, the Schottky barrier height $\Phi$b is an important parameter for determining the detection area of the infrared light sensor. In consideration thereof, these parameters were obtained. The measurement result is shown in Table 3. The parameters were calculated based on a method described in "Guirong Liang, Tianhong Cui, Kody Varahramyan, "Fabrication and electrical characteristics of polymer-based Schottky diode" Solid-State Electronics 47 (2003) 691-694".

TABLE 3

| Structure | Rs [kΩ] | Φb [eV] | n Value |
|---|---|---|---|
| Example 1-1 | 3.68 | 0.788 | 1.07 |
| Example 1-2 | 9.53 | 0.811 | 1.16 |
| Reference Diode | 24.2 | 0.814 | 1.36 |

As is apparent from Table 3, when Examples 1-1, 1-2 are compared with the reference diode without having the concavo-convex structure, it can be found that (1) the photodetectors 60 of Examples 1-1, 1-2 are lower in parasitic resistance R2, and (2) Examples 1-1, 1-2 are almost the same as the reference diode in the Schottky barrier height Φb. As for the reason of (1), it may be assumed that the contact area between Au and the organic semiconductor forming the concavo-convex structure was increased to be larger than the contact area between Au and the n-type silicon, which increased the number of current paths. Meanwhile, as for (2), a conceivable reason is that the detection areas of the photodetectors 60 of Examples 1-1, 1-2 are almost the same as the detection area of the reference diode when the photodetectors 60 of Examples 1-1, 1-2 are used as infrared sensors. Further, all the n values are 1.5 or less. This means that the predominant drive current in the photodetectors 60 of Examples 1-1, 1-2 is a diffusion current, indicating that an excellent diode operation with little defect is implemented.

We further evaluated the spectral sensitivity characteristic of the photodetector 60. In the evaluation, the sensitivity was evaluated in a wavelength range λ which is targeted to λ=1000 nm to 1500 nm in order to make the evaluation in a long-wavelength range. Meanwhile, a source measure unit (Model 2400 manufactured by Keithley Instruments Inc.) was used for current detection, and the current detection was performed with the application voltage of 0 v (i.e., during short circuit). The result thereof is shown in FIG. 12B.

Figure 12B:
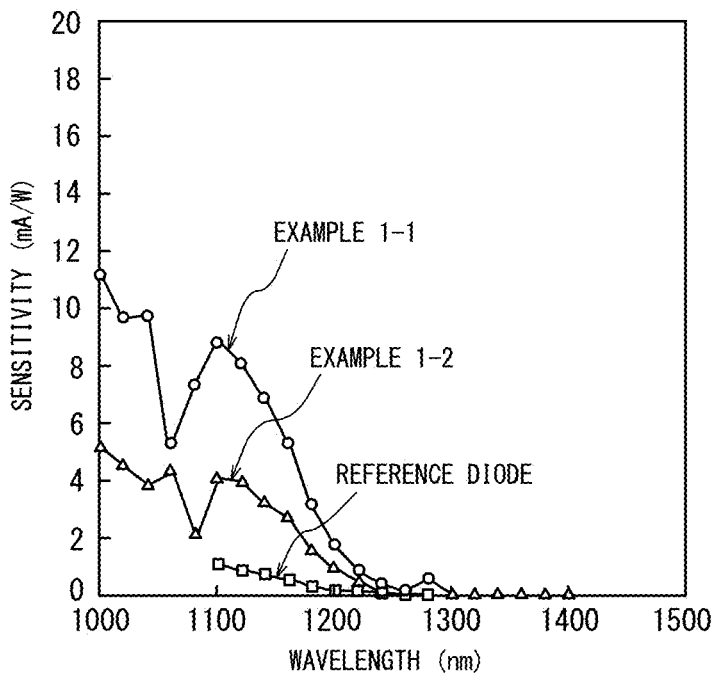
FIG. 12B are graphs each showing the electrical characteristics and the spectral sensitivity characteristic, respectively, of the photodetector of Example 1.

Referring to FIG. 12B, Examples are compared with one another for the sensitivity characteristic at λ=1200 nm, and found that the sensitivity for Example 1-1 was 1.79 mA/W, for Example 1-2 was 0.945 mA/W, and for the reference diode was 0.141 mA/W. The result has revealed that the presence of the concavo-convex structure increases the sensitivity at this wavelength. Specifically, Example 1-1 was confirmed to be improved in sensitivity by approximately 12.7-fold, which is an increase of one or more digits, with respect to the reference diode. Example 1-2 was confirmed to be improved in sensitivity by approximately 6.7-fold with respect to the reference diode. The light having this wavelength (λ=1200 nm) has an energy (hv=1.03 eV) that is equal to or smaller than the band gap of silicon (Eg=1.12 eV), and thus, it can be assumed that the light having this wavelength is absorbed in the Au layer 90. In view of this, it can be identified that the light absorption in the Au layer 90 has been increased because the diode having a concavo-convex structure is increased in sensitivity at this wavelength as compared with the sensitivity of the reference diode.

Considering the above, Example 1 allows for providing a photodetector that is easy to manufacture and capable of performing highly-sensitive detection of light even in the infrared region irrespective of the incident angle. Further, the use of the silicon substrate 70, which is highly versatile, allows for cost reduction and facilitates integration, making it possible to provide a wider range of application.

Example 2

Figure 13:
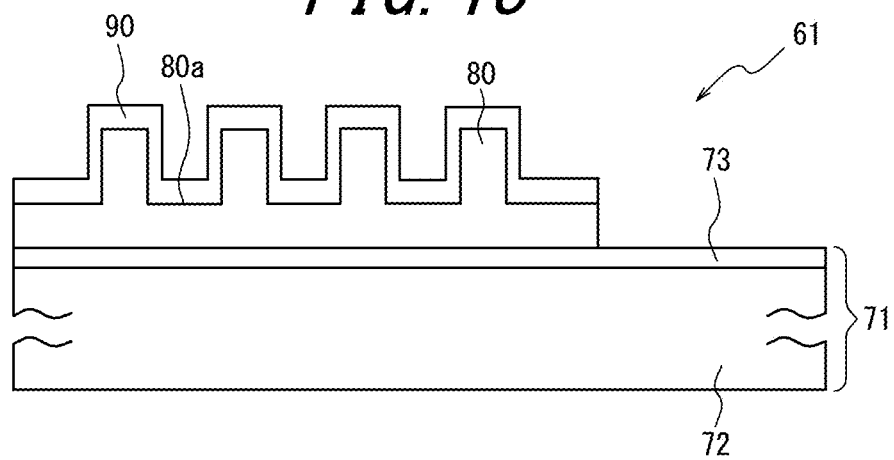
FIG. 13 is a sectional view illustrating a schematic configuration of the photodetector of Example 2.

FIG. 13 is a sectional view illustrating a schematic configuration of the photodetector of Example 2. The photodetector 61 of Example 2 includes a conductive substrate 71 as a replacement for the silicone substrate 70 and the Al layer 100 of the photodetector 60 of FIG. 4. The conductive substrate 71 is formed by vapor-depositing a transparent electrode (indium tin oxide (ITO)) 73 onto a polyimide substrate 72, with an organic semiconductor portion 80 being formed on the transparent electrode 73. The rest of the configuration is the same as that of FIG. 4, and thus the same constituent elements as those of FIG. 4 are denoted by the same reference symbols to omit the description thereof.

In Example 2, electrons excited in the Au layer 90 by localized plasmon resonance and/or surface plasmon resonance overcome a Schottky barrier at the junction 80a between the Au layer 90 and the organic semiconductor portion 80 to be injected into the organic semiconductor portion 80. Then, the electrons injected into the organic semiconductor portion 80 are taken out therefrom via the transparent electrode 73 of the conductive substrate 71.

In manufacturing the photodetector 61 of FIG. 13, a transparent oxide material (ITO) is first vapor-deposited onto a commercially-available polyimide substrate 72 to form a transparent electrode 73, to thereby prepare a conductive substrate 71. Thereafter, as in the case of Example 1, the organic semiconductor portion 80 having a concavo-convex structure formed of PTCDA/CuP is constructed on the transparent electrode 73, and then Au is further vapor-deposited onto the concavo-convex side of the organic semiconductor portion 80 to form the Au layer 90, to thereby fabricate the photodetector 61.

The photodetector 61 of Example 2 was measured for spectral sensitivity characteristic with the use of a source measure unit, in the same manner as in Example 1. As a result, optical response was identified in the infrared region (λ=1200 nm). Further, in Example 2, the conductive substrate 71 is not limited to ITO/polyimide, and may be formed of a flexible conductive substrate such as ITO/PET (polyethylene terephthalate) or aluminum foil. Accordingly, the photodetector 61 of Example 2 is capable of not only providing the same effect as in Example 1 but also being implemented as a flexible sensor, and thus can be developed for ubiquitous applications.

Example 3

Figure 14:
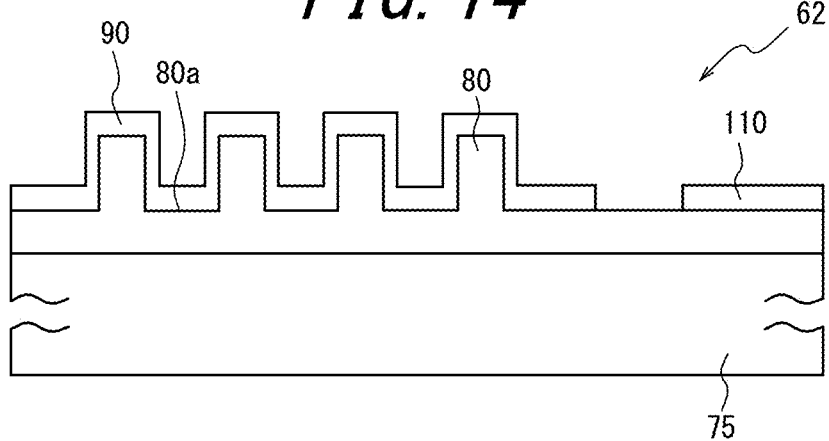
FIG. 14 is a sectional view illustrating a schematic configuration of the photodetector of Example 3.

FIG. 14 is a sectional view illustrating a schematic configuration of the photodetector of Example 3. The photodetector 62 of Example 3 includes a glass substrate 75 and a metal junction 110 being as replacements for the silicon substrate 70 and the Al layer 100 of the photodetector 60 of FIG. 4. The metal junction 110 may be made of, for example, platinum (Pt), which forms an Ohmic junction with part of the organic semiconductor portion 80. The rest of the configuration is the same as that of FIG. 4, and thus the same constituent elements as those of FIG. 4 are denoted by the same reference symbols to omit the description thereof.

In Example 3, electrons excited in the Au layer 90 through localized plasmon resonance and/or surface plasmon resonance overcome a Schottky barrier at the junction 80a between the Au layer 90 and the organic semiconductor portion 80 to be injected into the organic semiconductor portion 80. Then, the electrons injected into the organic semiconductor portion 80 are taken out therefrom via the metal junction 110.

In manufacturing the photodetector 62 of FIG. 14, the organic semiconductor portion 80 having a concavo-convex structure formed of PTCDA/CuP is first constructed on the glass substrate 75 as in the case of Example 1, and further Au is vapor-deposited onto the concavo-convex side of the organic semiconductor portion 80 to form the Au layer 90. Thereafter, the metal junction 110 is vapor-deposited onto part of the organic semiconductor portion 80 to form an Ohmic junction therewith, to thereby fabricate the photodetector 62.

The photodetector 62 of Example 3 was measured for spectral sensitivity characteristic with the use of a source measure unit, as in the case of Example 1, with the Au layer 90 side being set as a positive electrode and the metal junction 110 side being set a negative electrode. As a result, optical response was identified in the infrared region ($\lambda$=1200 nm). Accordingly, the photodetector 62 of Example 3 is capable of providing the same effect as in Example 1. In addition, the photodetector 62 of Example 3 can be surface-mounted onto an insulating substrate such as the glass substrate 75, and thus can be directly mounted onto, for example, the windshield of a vehicle, which provides an effect of increasing applicability of the system.

Example 4

Figure 15:
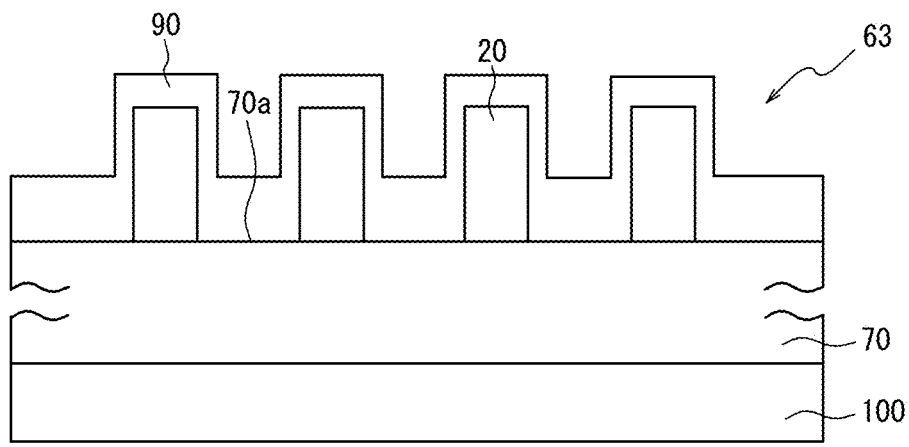
FIG. 15 is a sectional view illustrating a schematic configuration of the photodetector of Example 4.

FIG. 15 is a sectional view illustrating a schematic configuration of the photodetector of Example 4. The photodetector 63 of Example 4 has the organic semiconductor 20 of the photodetector 60 of FIG. 4 formed in a protruding shape (columnar shape) directly on the silicon substrate 70. In other words, the semiconductor 40 of FIG. 1 is replaced with the silicon substrate 70. Therefore, in Example 4, the Au layer 90 comes into contact with the organic semiconductor 20 and the silicon substrate 70, and thus, electrons excited in the Au layer 90 by localized plasmon resonance and/or surface plasmon resonance overcome a Schottky barrier at the junction 70a between the Au layer 90 and the silicon substrate 70 to be taken out from the Al layer 100 via the silicon substrate 70.

In manufacturing the photodetector 62 of FIG. 15, the substrate temperature of the silicon substrate 70 and the conditions of vapor-depositing PTCDA/CuPc constituting the organic semiconductor 20 are optimized, to thereby form, on the silicon substrate 70, portions with or without the organic semiconductor 20 in a protruding shape. Thereafter, the Au layer 90 is vapor-deposited on the organic semiconductor 20 side of the silicon substrate 70 while vapor-depositing the Al layer 100 on the other side thereof, to thereby fabricate the photodetector 63.

The photodetector 63 of Example 4 was measured for spectral sensitivity characteristic with the use of a source measure unit, in the same manner as in Example 1. As a result, optical response was identified in the infrared region ($\lambda$=1200 nm). Therefore, an effect of promoting light absorption through plasmon resonance can similarly be attained in Example 4, providing the same effect as in Example 1.

Figure 16:
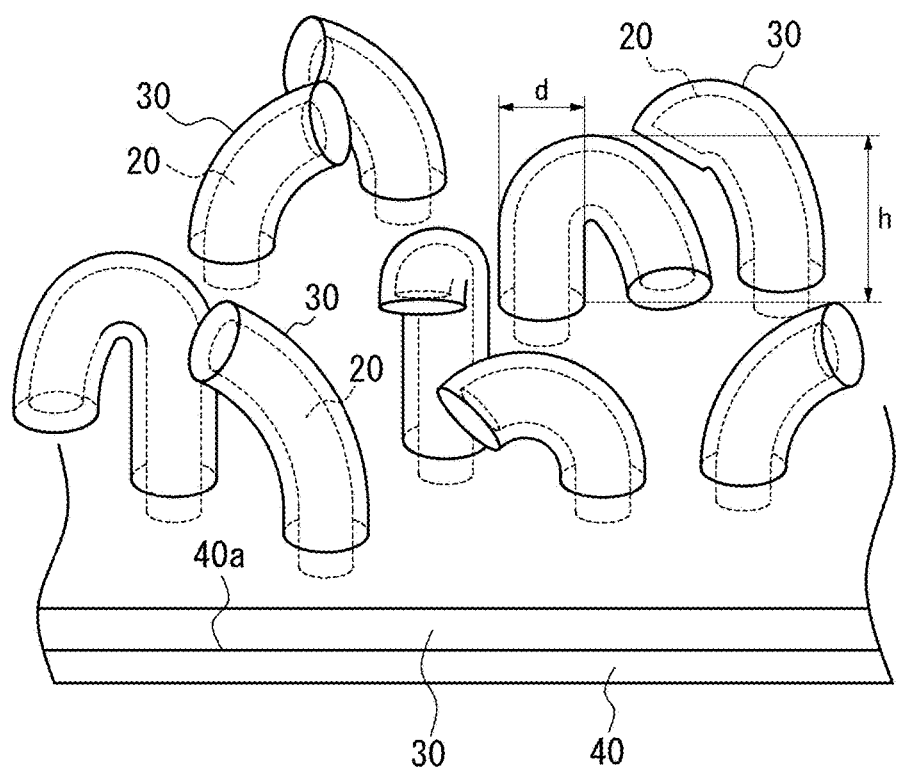
FIG. 16 is a schematic perspective view illustrating a modified example of the disclosed photodetector.

It should be noted that the disclosed photodetector is not limited to Examples above, and may be subjected to various modifications and alterations without departing from the gist of the present disclosure. For example, according to the disclosed photodetector, as illustrated in the schematic perspective view of FIG. 16, the plurality of columnar protrusions formed into a concavo-convex structure including the metal layer 30 each may be curved or bent at an arbitrary curvature or angle so as to be formed into an arbitrary shape. This configuration facilitates the fabrication. In this case, the protrusion of the concavo-convex structure may have a height h including the metal layer 30, i.e., a width in a vertical direction between the protrusion and the recess of the metal layer 30, the height h or the width being defined to be in a dimension equal to or smaller than the wavelength of the detection light, as in the cases of the aforementioned disclosed photodetectors, and may more preferably be defined in a dimension equal to or smaller than 1/10 to 1/5 of the detection wavelength, while the protrusion has a thickness or a maximum dimension d in section perpendicular to the height direction of the protrusion being defined to be equal to or smaller than the wavelength of the detection light.

REFERENCE SIGNS LIST 10 photodetector
20 organic semiconductor
30 metal layer
40 semiconductor
40a junction
50 current detector
60, 61, 62, 63 photodetector
70 silicon substrate
70a junction
71 conductive substrate
72 polyimide substrate
73 transparent electrode
75 glass substrate
80 organic semiconductor portion
80a junction
90 Au layer
100 Al layer
110 metal junction

The invention claimed is:
1. A device comprising:
a photodetector comprising:
    a semiconductor layer comprising an inorganic semiconductor;
    protrusions comprising an organic semiconductor being composed of CuPc, wherein the protrusions are provided over the semiconductor layer; and
    a metal layer provided over the semiconductor layer and the protrusions, wherein the metal layer generates at least one of localized plasmon resonance and surface plasmon resonance in which electrons are excited through direct irradiation by detection light,
    wherein the semiconductor layer and the metal layer forms a Schottky barrier at a junction between the semiconductor layer and the metal layer, and
    wherein the semiconductor layer allows the electrons excited in the metal layer through the at least one of localized plasmon resonance and surface plasmon resonance, overcoming the Schottky barrier at the junction between the organic semiconductor and the metal layer and flowing as a diffusion current, to pass from the organic semiconductor to the semiconductor layer.
2. The device according to claim 1,
wherein the protrusions and the metal layer form a concavo-convex structure over the semiconductor layer,
wherein a convex portion of the concavo-convex structure has a dimension in a height direction, perpendicular to the semiconductor layer, equal to or smaller than a wavelength of the detection light, and
wherein a concave portion of the concavo-convex structure has a maximum dimension in a thickness direction, perpendicular to the height direction, equal to or smaller than the wavelength of the detection light.

3. The device according to claim 2, wherein convex portions of the concavo-convex structure each have a dimension in the height direction of 20 nm or more.

4. The device according to claim 2, wherein convex portions of the concavo-convex structure each have a dimension in the height direction of 50 nm or more.

5. The device according to claim 2, wherein convex portions of the concavo-convex structure are formed to be curved or bent in an arbitrary shape.

6. The device according to claim 2, wherein convex portions of the concavo-convex structure are formed in irregularly columnar shapes.

7. The device according to claim 2, wherein convex portions of the concavo-convex structure are formed in columnar shapes, and
wherein a dimension of each of the convex portions in the height direction, perpendicular to the semiconductor layer, is longer than a dimension, in a width direction perpendicular to the height direction, of a portion of the junction between the convex portions.

8. The device according to claim 2, wherein a dimension of each of convex portions of the concavo-convex structure in the height direction, perpendicular to the semiconductor layer, or a dimension of each of the convex portions in the thickness direction, perpendicular to the height direction, is equal to or smaller than the wavelength of the detection light.

9. The device according to claim 1, further comprising a substrate supporting the semiconductor layer.

10. The device according to claim 9, wherein the substrate is a semiconductor substrate.

11. The device according to claim 9, wherein the substrate is a conductive substrate.

12. The device according to claim 9, wherein the substrate is an insulating substrate.

13. The device according to claim 1, wherein the protrusions are formed through crystal growth.

14. The device according to claim 1, wherein the organic semiconductor comprises one of:
a phthalocyanine-based material;
a thiophene-based material; and
Alq3.

15. The device according to claim 1, wherein a material of the metal layer comprises one of:
Au;
Pt;
Al; and
Ag.

16. The device according to claim 1, wherein a material of the metal layer is selected to promote localized plasmon resonance.

* * * * *